United States Patent [19]

Leonida

[11] Patent Number: 5,367,200
[45] Date of Patent: Nov. 22, 1994

[54] METHOD AND APPARATUS FOR MEASURING THE DUTY CYCLE OF A DIGITAL SIGNAL

[75] Inventor: Dan Leonida, Ottawa, Canada

[73] Assignee: Northern Telecom Limited, Montreal, Canada

[21] Appl. No.: 158,546

[22] Filed: Nov. 29, 1993

[51] Int. Cl.[5] .................... H03K 3/017; H03K 3/84; H03K 5/26
[52] U.S. Cl. .................... 327/33; 329/312; 364/484; 327/35; 327/141
[58] Field of Search .................... 307/516; 377/10; 329/312; 364/484, 486

[56] References Cited

U.S. PATENT DOCUMENTS

| | | | |
|---|---|---|---|
| 3,986,136 | 10/1976 | Hurlburt | 307/265 |
| 4,350,950 | 9/1982 | Waldmann et al. | 364/484 |
| 4,841,451 | 6/1989 | Rumpf et al. | 364/484 |
| 5,210,444 | 5/1993 | Johnson | 307/265 |
| 5,225,715 | 7/1993 | Mori et al. | 307/269 |

*Primary Examiner*—Timothy P. Callahan
*Assistant Examiner*—Terry L. Englund
*Attorney, Agent, or Firm*—Yoshiharu Toyooka

[57] ABSTRACT

The technique of measuring the duty cycle of a digital signal of known repetition rate is disclosed. It makes use of the fact that the probability of the digital signal being at the high level is related to its duty cycle when the signal is sampled at a frequency incoherent with the repetition rate. The apparatus in one embodiment includes a random sampler for sampling the digital signal under measurement, and digital counters which count the total number of samples and the number of samples whose values are at one of the two digital levels.

11 Claims, 3 Drawing Sheets

METHOD AND APPARATUS FOR MEASURING THE DUTY CYCLE OF A DIGITAL SIGNAL

FIELD OF THE INVENTION

The invention generally relates to digital electronic control circuits and a method for determining one or more characteristics of an electrical signal. More specifically, the invention relates to an apparatus and method for determining the duty cycle of a periodic digital signal of a fixed repetition rate.

BACKGROUND OF THE INVENTION

There are many circuits and systems that utilize a periodic digital signal in which the duty cycle of the signal is an important parameter. For example, in digital electronic systems, synchronization is a very important element, that is, the clock signal keeps various segments of the system in synchrony for proper operation. In many instances, a main clock generates the clock signal but the signal must travel to different parts of the system or must be processed by different components having different delay characteristics. In high speed digital systems, the skew among the clock signals must be properly handled. The skew (delay) between two clock signals of the same clock frequency can be easily measured by calculating the duty cycle of a digital signal generated by combining the two clock signals.

The duty cycle is also important in other areas. Circuits and systems employing pulse width modulation techniques may include a feedback loop based on the duty cycle of a signal. The duty cycle, of course, is commonly defined as the percentage of time over one cycle that a digital signal is in a positive or active state, usually expressed as a percent.

U.S. Pat. No. 5,210,444, issued May 11, 1993 (Johnson), describes a duty cycle meter for measuring the duty cycle of a digital signal of a known frequency. It uses a local oscillator which produces pulses at a frequency higher than that of the digital signal. It counts the number of oscillator pulses during the period when the digital signal is at the active state (high level). In a specific embodiment the oscillator frequency is a power of ten multiple of the digital signal frequency. In this case the number of oscillator pulses is a direct indication of the duty cycle. The technique described therein, however, requires a local oscillator which must operate faster than the digital signal to be measured. For high speed digital systems this may not be possible and would also give bad resolution.

OBJECTS OF THE INVENTION

It is therefore an object of the present invention to provide a method and apparatus for digitally measuring the duty cycle of a digital signal.

It is another object of the present invention to provide a method and apparatus for digitally measuring the duty cycle of a digital signal by employing a random sampling technique.

SUMMARY OF THE INVENTION

Briefly stated, the present invention is directed to a method of measuring the duty cycle of a digital signal of a fixed repetition rate. The method comprises steps of sampling the digital signal at a sampling frequency which is incoherent with the fixed repetition rate to produce a predetermined total number of samples $N_t$ and counting the number of samples $N_1$ which are at one of the two digital levels. The method further includes a step of calculating the ratio of $N_1$ to $N_t$ which is indicative of the duty cycle.

According to another aspect, the invention is directed to a digital duty cycle measuring apparatus which comprises sampling means for sampling the digital signal at a sampling frequency which is incoherent with the fixed repetition rate to produce a predetermined total number of samples $N_t$. The apparatus further includes counter means for counting the number of samples $N_1$ which are at one of the two digital levels, and calculation means for generating the ratio of $N_1$ to $N_t$ which is indicative of the duty cycle of the digital signal.

BRIEF DESCRIPTION OF THE DRAWINGS

For a more complete understanding of the present invention and for further objects and advantages thereof, reference may now be made to the following description, taken in conjunction with the accompanying drawings, in which.

DETAILED DESCRIPTION OF THE PREFERRED EMBODIMENTS OF THE INVENTION

Figure 1:
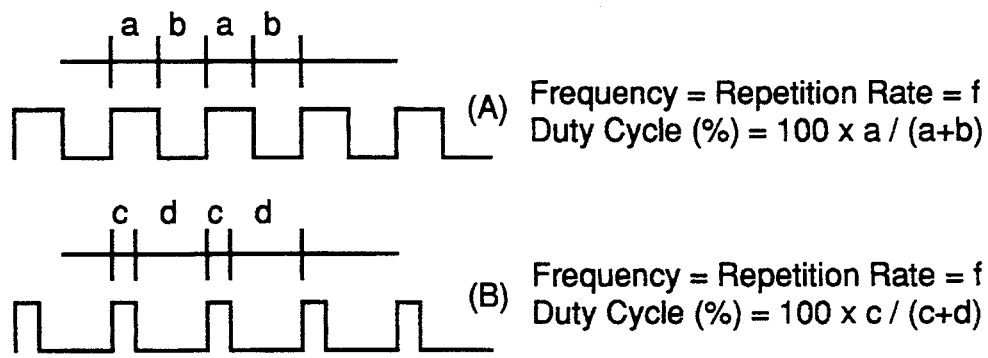
FIG. 1 shows digital signals having the same repetition rate but different duty cycles.

FIG. 1 shows two digital signals, each composed of a series of pulses, indicating that the signal is either at the high state or the low state. The repetition rate is f pps (pulses per second) for both signals. The repetition rate is the digital equivalent of the frequency of an AC signal, but both terms are also often used synonymously in the digital context. The duty cycle, however, of signal A is 100 a/(a+b) (%) and that of signal B is 100 c/(c+d) (%).

Figure 2:
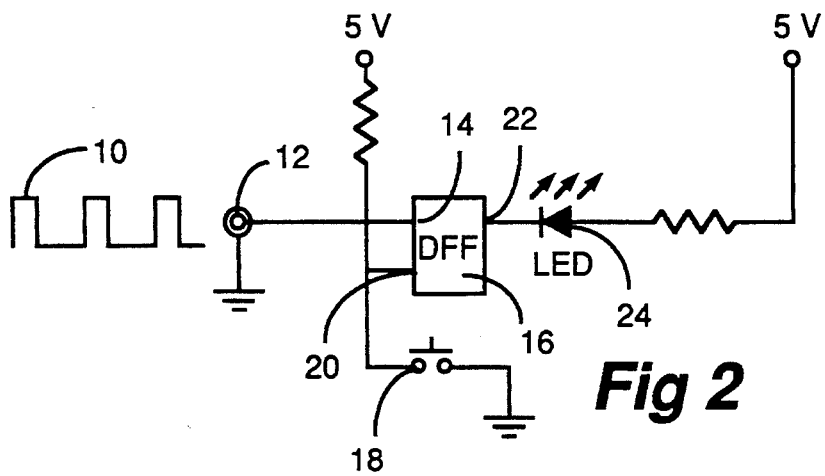
FIG. 2 is a conceptual block diagram of a duty cycle measuring apparatus according to the present invention.

Referring to FIG. 2, the principle of the present invention is described. A digital signal 10 is applied to the input terminal 12. A clock signal or some such periodic signals have pulses appearing at a preset repetition rate. The digital signal of a fixed repetition rate $t_i$ is applied to one data input 14 of a flip-flop 16 (D-type flip-flop). A push button 18 causes 5 volts to be applied to another clock input 20 of the flip-flop 16. The output 22 of the flip-flop 16 turns on an LED 24 when it is at the low state. In this circuit setup, the duty cycle is defined as: "the probability of the LED 24 being "off" when the push button 18 is pushed, provided that the push button is activated completely at random with respect to the phase of the input digital signal".

Figure 3:
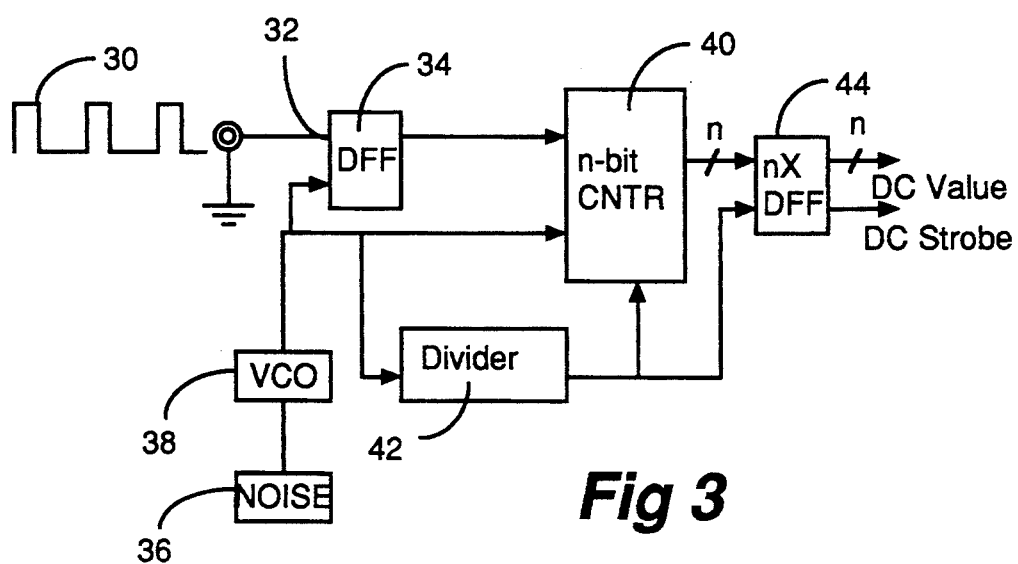
FIG. 3 is a schematic block diagram of a duty cycle measuring apparatus according to one embodiment of the present invention.

One of the preferred embodiments is schematically illustrated in FIG. 3. In the figure, a digital signal 30 of a fixed repetition rate is applied to one input 32 of a flip-flop 34. A random noise generator 36 generates a random noise commonly called the white noise which gives a flat and wide frequency spectrum. A voltage controlled oscillator 38 is modulated in frequency by the noise generator 36 to produce a random sampling signal. The random sampling signal is applied to the clock input of the flip-flop 34 to ensure that sampling is completely random with respect to the input digital signal. Thus the flip-flop 34 produces at its output a sampled signal which is indicative of whether or not the input digital signal is at high level at the random sampling time. The random sampling signal from the voltage controlled oscillator 38 is also applied to an n-bit counter 40 and a divider 42. The n-bit counter 40 is another flip-flop and takes in the sampled signal from the flip-flop 34 and counts up the number every time both the sampled signal and the random sampling signal are high, thus generating an output in n bits indicative of the number of sampled signals $N_1$ found to be high. The divider 42 produces a signal which clocks the flip-flop 44 and resets the n-bit counter after every predetermined number of samples $N_t$. The divider therefore averages out the sampled "high" signals over the predetermined number of readings, which number is adjustable. The larger the predetermined number, the higher the resolution. For example, if the divider is set, say, at 1,000,000, the resolution is one part per million, in other words, $10^{-4}\%$. Of course, n in the n-bit counter must be 20 bits or over to accommodate a maximum of one million. An nX flip-flop 44 calculates the ratio $N_1$ to $N_t$ and produces an output indicative of the duty cycle.

In the above embodiment, the random noise generator is used for random sampling. However, it should of course be noted, the only requirement is that the sampling is incoherent with the input signal, in other words, the sampling should not have any fixed phase relationship with the input signal. Therefore, in place of the random noise generator, i.e. a Zener diode, and VCO, it is possible to use, for example, a ramp generator and a VCO, as long as the sampling frequency and the repetition rate of the input signal do not have any rational relationship.

Figure 4:
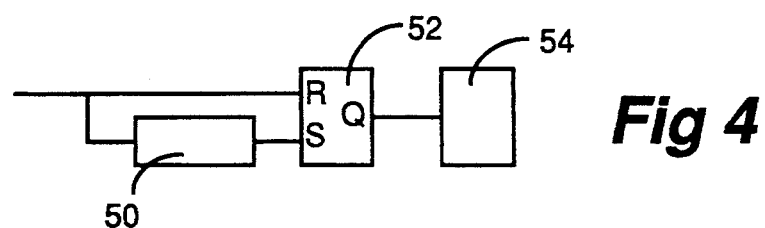
FIG. 4 is a block diagram of a time delay measuring apparatus according to one embodiment of the present invention.
Figure 5:
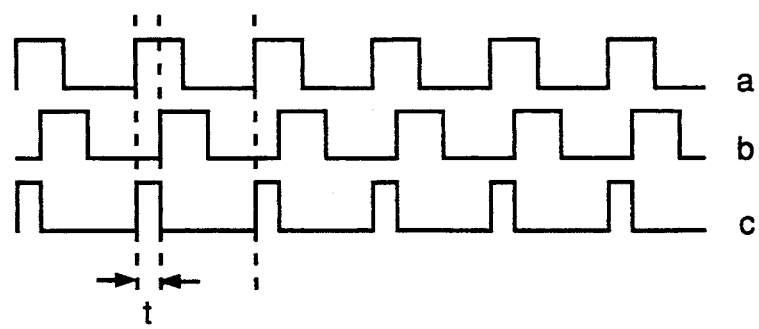
FIG. 5 shows the relationship among digital signals appearing at various points of the apparatus shown in FIG. 4.

Referring to FIG. 4, there is illustrated a schematic block diagram of a setup which can be used for measuring the time delay of a system. The system 50 whose time delay is to be measured is connected to an RS flip-flop 52 at one input terminal and an input digital signal of a fixed and known repetition rate is applied to the second input terminal of the flip-flop 52, as well as to the system 50 under test. A digital signal appearing at the output Q of the flip-flop 52 has a duty cycle indicative of the delay as illustrated in FIG. 5. In FIG. 5, (a) is a digital signal of a known repetition rate and (b) is the same digital signal which has been put through the system 50, thus incurring an unknown time delay t. The flip-flop 52 produces an output which is shown at (c), indicating that the duty cycle is proportional to the time delay. The duty cycle measurement apparatus described in FIG. 3 is used at 54. If the repetition rate (frequency) of the input digital signal is known, the output of the duty cycle measurement apparatus 54 can be easily calibrated to the time delay in a desired unit by the following equation:

$$Delay = Duty\ Cycle \times T = (Duty\ Cycle/F)$$

wherein T and F are, respectively, the period and frequency of the input digital signal.

Figure 6:
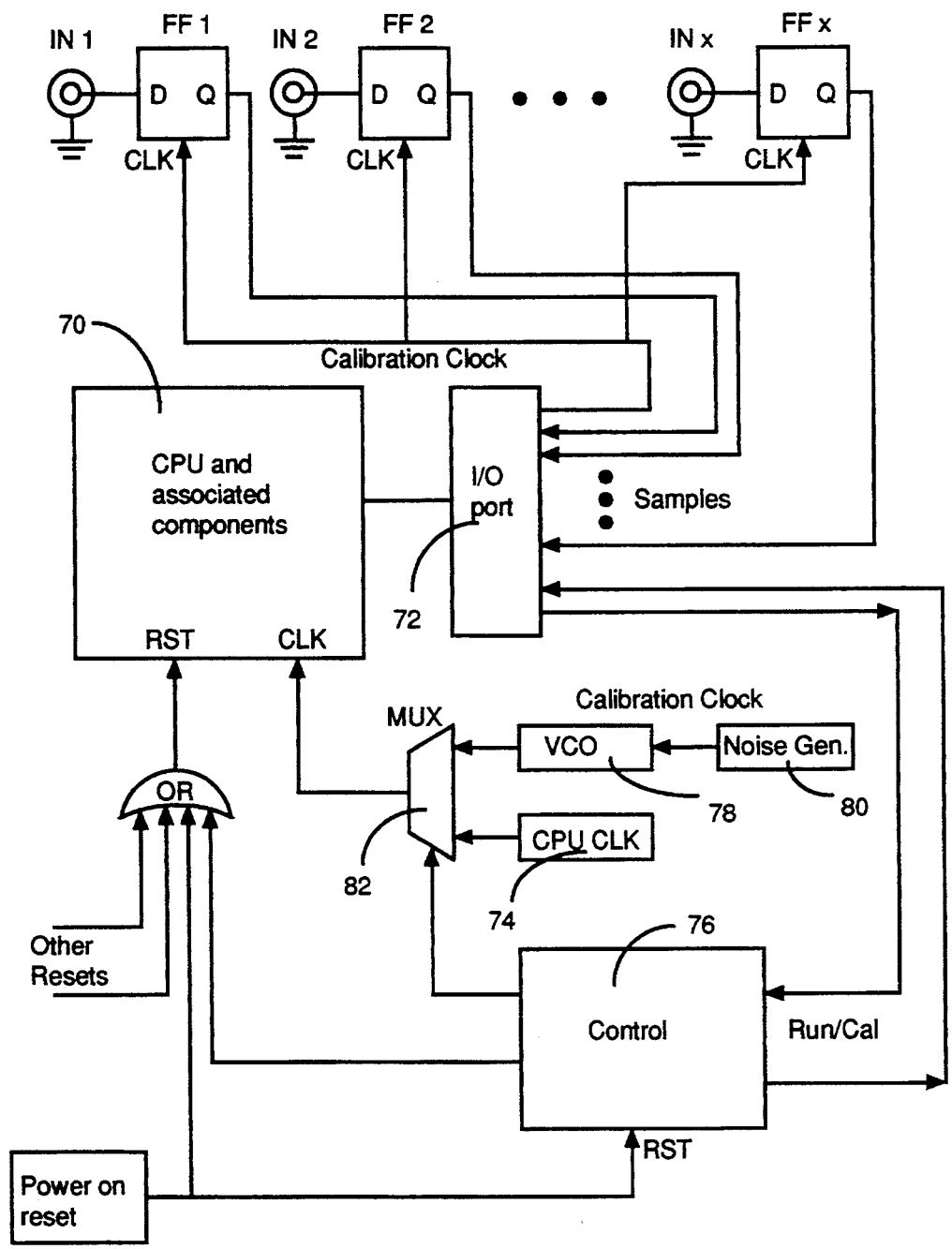
FIG. 6 is another embodiment of the present invention which utilizes a microprocessor.

FIG. 6 is another embodiment of the present invention. As microcomputer systems are being used more and more for control of operations, recording and displaying of data, and other purposes, it is possible to utilize a CPU and other associated components which are provided for these purposes, and for duty cycle or phase delay measurements of periodic signals. In this way, dedicated dividers and counters shown in FIG. 3 are not needed. The measured delays can be used for performance improvement of an instrument. In FIG. 6, therefore, the CPU 70, I/O port 72, CPU dock 74 and control 76 are shown, but they are almost invariably provided in any microcomputer system. Multiple input signals IN 1 to IN x are applied to respective flip-flops FF 1 to FF x. The calibration clock includes a VCO 78 and a noise generator 80, and produces a sampling clock signal. When the control 76 indicates that the duty cycle or phase measurement (phase calibration) is to be performed, a MUX 82 chooses the sampling clock signal and sends it to the CPU, which in turn transmits it to the flip-flops via the I/O port for random sampling of input signals. Sampled input signals from the flip-flops are sent to the CPU for processing. After processing, the CPU produces an output which is sent through the I/O port to control 76 for intended controlling purposes or simply for display or recording. In this embodiment, flip-flops, MUX, and a calibration clock, which includes a VCO and a noise generator, are additionally required. The CPU and other components can be software programmed for proper operation.

What is claimed is:

1. A method of measuring the duty cycle of a digital signal of a fixed repetition rate, comprising steps of:
   sampling the digital signal at a sampling frequency which is incoherent with the fixed repetition rate;
   producing a total number of samples $N_t$ of the digital signal;
   counting a number of samples $N_1$ which are at one of two digital levels; and
   calculating a ratio of $N_1$ to $N_t$ which is indicative of the duty cycle.

2. The method of measuring the duty cycle of a digital signal of a fixed repetition rate according to claim 1, wherein the step of sampling is performed at randomly variable sampling frequency.

3. The method of measuring the duty cycle of a digital signal of a fixed repetition rate according to claim 2, wherein the step of randomly sampling the digital signal comprises further steps of:
   generating a random noise; and
   modulating a voltage controlled oscillator by the random noise to produce a random sampling signal.

4. A method of measuring a time delay of a digital system by measuring the duty cycle of a digital signal of a known repetition rate, according to claim 3, comprising further steps of:
   applying the digital signal of the known repetition rate to the digital system under test and a flip-flop; and
   generating a digital output signal of the known repetition rate whose duty cycle is indicative of the time delay of the digital system under test.

5. A digital duty cycle measuring apparatus for measuring a digital signal of a fixed repetition rate having two digital levels, comprising:
   sampling means for sampling the digital signal at a sampling frequency which is incoherent with the fixed repetition rate;

divider means for producing a total number of samples $N_t$ of the digital signal;

counter means for counting a number of samples $N_1$ which are at one of two digital levels; and calculation means for generating a ratio of $N_1$ to $N_t$ which is indicative of the duty cycle of the digital signal.

6. The digital duty cycle measuring apparatus according to claim 5, wherein the sampling frequency is a randomly variable frequency and the sampling means comprises a random noise generator connected to a voltage controlled oscillator to generate a sampling signal of randomly variable frequency, and a flip-flop to receive the sampling signal and the digital signal to be measured.

7. The digital duty cycle measuring apparatus according to claim 6, wherein the random noise generator is a Zener diode.

8. The digital duty cycle measuring apparatus according to claim 5, wherein the counter means comprises an n-bit counter for counting $N_1$, and the divider means resets the n-bit counter after $N_t$ samples, $N_t$ being adjustable.

9. The digital duty cycle measuring apparatus according to claim 5, wherein the calculating means comprises a flip-flop to generate a digital output signal indicative of the duty cycle.

10. The digital duty cycle measuring apparatus according to claim 8, wherein the counter means and the divider means are a programmed microprocessor.

11. The digital duty cycle measuring apparatus according to claim 9, wherein the calculating means is a programmed microprocessor.

* * * * *